United States Patent [19]
Liu et al.

[11] Patent Number: 5,326,714
[45] Date of Patent: Jul. 5, 1994

[54] METHOD OF MAKING A FULLY USED TUB DRAM CELL

[75] Inventors: H. T. Liu, Keelung; J. H. Lee, Taipei, both of Taiwan

[73] Assignee: Taiwan Semiconductor Manufacturing Company, Hsinchu, Taiwan

[21] Appl. No.: 94,702

[22] Filed: Jul. 22, 1993

[51] Int. Cl.$^5$ ............................................. H01L 21/70
[52] U.S. Cl. .................................... 437/52; 437/47; 437/60; 437/162; 437/200
[58] Field of Search ................ 437/47, 48, 52, 60, 437/233, 235, 238, 919, 162, 200

[56] References Cited

U.S. PATENT DOCUMENTS

| | | | |
|---|---|---|---|
| 4,742,018 | 5/1988 | Kimura et al. | 437/48 |
| 5,025,741 | 6/1991 | Suwanai et al. | 437/52 |
| 5,053,351 | 10/1991 | Fazan et al. | 437/52 |
| 5,102,820 | 4/1992 | Chiba | 437/52 |
| 5,120,674 | 6/1992 | Chin et al. | 437/52 |
| 5,137,842 | 8/1992 | Chan et al. | 437/60 |
| 5,164,337 | 11/1992 | Ogawa et al. | 437/919 |
| 5,196,364 | 3/1993 | Fazan et al. | 437/52 |
| 5,219,780 | 6/1993 | Jun | 437/60 |
| 5,223,729 | 6/1993 | Kudoh et al. | 437/919 |
| 5,234,858 | 10/1993 | Fazan et al. | 437/919 |
| 5,236,859 | 8/1993 | Bae et al. | 437/919 |

FOREIGN PATENT DOCUMENTS 0260453  10/1990  Japan ................................ 437/52

*Primary Examiner*—Tom Thomas
*Attorney, Agent, or Firm*—George O. Saile

[57] ABSTRACT

A method is described for forming a dynamic random access memory cell capacitor in which a polysilicon spacer is formed on top of the bottom polysilicon electrode to construct a tub shape and a wet dip is used to remove silicon oxide from cavities under the bottom polysilicon electrode, increasing the overlap with the top polysilicon electrode and thus increasing the surface area of the capacitor without increasing the area on the substrate occupied by the capacitor.

25 Claims, 6 Drawing Sheets

METHOD OF MAKING A FULLY USED TUB DRAM CELL

BACKGROUND OF THE INVENTION

1. Field of the Invention

The present invention relates to a method of fabricating a dynamic random access memory having an increased capacitance capacitor by incorporating a tub shape and by increasing the bottom electrode and top electrode overlap area.

2. Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked capacitor design in which the capacitor cell uses the space over the device area for the capacitor plates. In their U.S. Pat. No. 5,053,351 to Fazan et al, the inventors describe a three-dimensional stacked capacitor which they call a stacked E cell. The storage node plate of this capacitor has an E-shaped cross-section. U.S. Pat. No. 4,742,018 to Kimura et al describes two separate embodiments of a stacked capacitor. The first embodiment provides for both top and bottom surfaces of the capacitor plate to be used for storage. The second embodiment provides sidewall structures for additional capacitance. Even higher capacitance can be achieved by incorporating a variety of techniques into one improved process.

SUMMARY OF THE INVENTION

Accordingly, it is a primary object of the invention to provide an improved and very manufacturable process for producing a memory cell capacitor with increased capacitance.

A method is described for forming a dynamic random access memory cell capacitor in which a polysilicon spacer is formed on top of the bottom polysilicon electrode to construct a tub shape and a wet dip is used to remove silicon oxide from cavities under the bottom polysilicon electrode, increasing the overlap with the top polysilicon electrode and thus increasing the surface area of the capacitor without increasing the area on the substrate occupied by the capacitor.

Field oxide regions are formed in and on a semiconductor substrate. Gate electrodes which are typically formed of polysilicon (zero level layer) and lightly doped drain regions are formed in and on the substrate. A first layer of silicon oxide is formed overlying the gate electrodes. A layer of silicon nitride is deposited overlying the first silicon oxide layer. A second layer of silicon oxide is formed overlying the silicon nitride layer. A contact is opened through the first and second silicon oxide layers and the silicon nitride layer to the lightly doped drain region which will form the node of the capacitor.

A first layer of polysilicon is deposited overlying the silicon nitride layer and filling the contact opening. A thick layer of silicon oxide is deposited overlying the first polysilicon layer and is patterned to leave its remaining portion over the planned capacitor area. A second layer of polysilicon is deposited overlying the patterned thick silicon oxide layer. The polysilicon layers are anisotropically etched to remove all of the second polysilicon layer except for spacers on the sidewalls of the thick silicon oxide layer and to remove all of the first polysilicon layer except for the portions underlying the patterned thick silicon oxide layer and underlying the spacers. This results in a tub shape. The second silicon oxide layer and the remaining thick silicon oxide are etched away leaving cavities underlying the first and second polysilicon layers. The portion of the first polysilicon layer contacting the node contact forms the bottom electrode. The top and bottom surfaces of the first polysilicon and the second polysilicon sidewalls form the storage node of the capacitor. A capacitor dielectric layer is deposited over all surfaces of the substrate. A third polysilicon layer is deposited conformally so that the third polysilicon layer covers the first and second polysilicon layers over the capacitor dielectric and fills all said cavities underlying the first and second polysilicon layers wherein the third polysilicon layer forms the top electrode of the capacitor.

A first thick insulating layer is deposited over the surface of the substrate and flowed. A fourth layer of polysilicon is deposited overlying the first thick insulating layer. A silicide layer is formed over the fourth polysilicon layer. A second thick insulating layer is deposited over the silicide layer and flowed. Contacts are opened through the thick insulating layers to the silicide layer and to the third polysilicon layer connected to the top node of the capacitor. A metal layer is deposited to complete contacts to the silicide layer or to the third polysilicon layer connecting to the top node of the capacitor to complete formation of the DRAM with capacitor.

BRIEF DESCRIPTION OF THE DRAWINGS

In the following drawings forming a material part of this description, there is shown.

DESCRIPTION OF THE PREFERRED EMBODIMENTS

Figure 1:
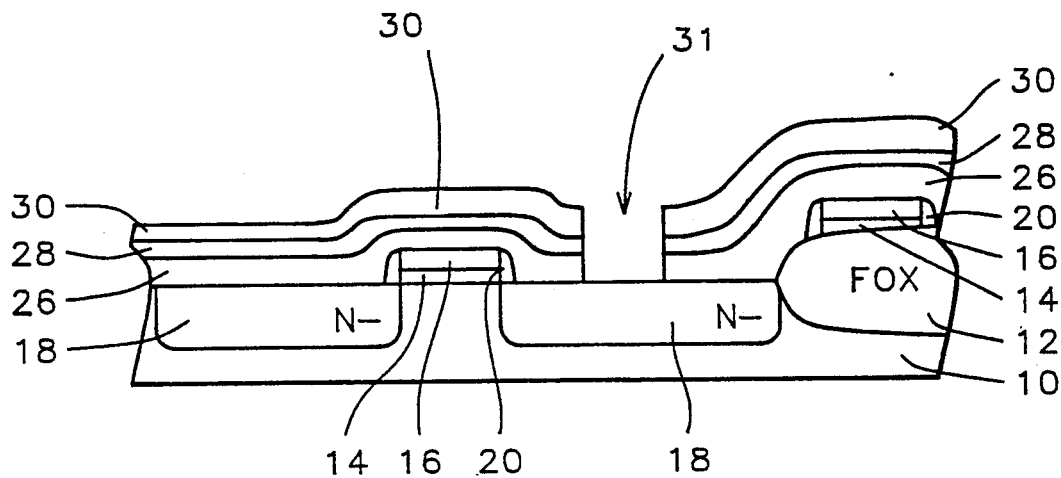
FIGS. 1 through 8 are schematic cross-sectional representations of a preferred embodiment of the present invention.
Figure 2:
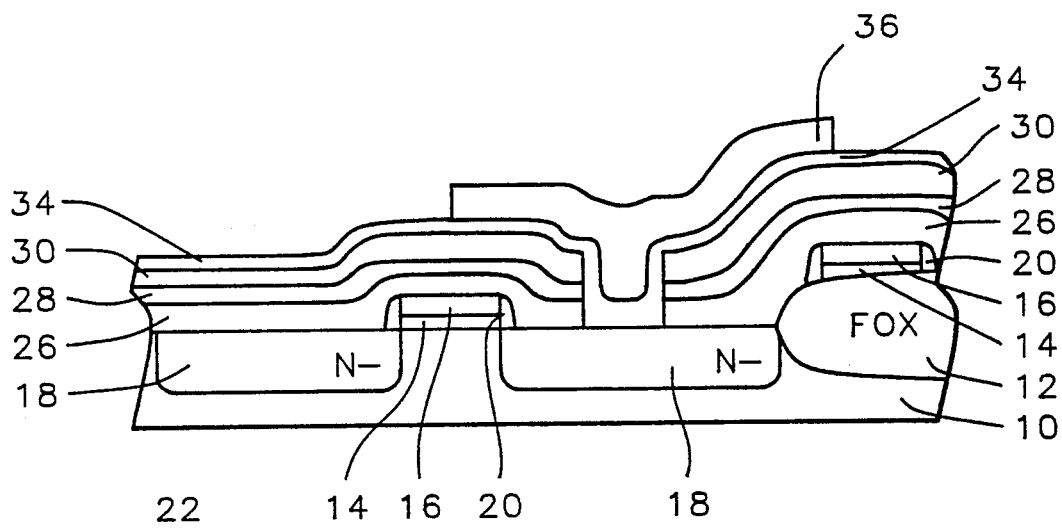

Referring now more particularly to FIG. 1, the first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No.

3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 100 to 250 Angstroms. The polysilicon layer 16 (zero level layer) is blanket deposited by low pressure chemical vapor deposition (LPCVD) to a preferred thickness of between about 2000 to 3500 Angstroms. The polysilicon layer 16 is doped in-situ, ion implanted or doped with $POCl_3$ after deposition. The layers 14 and 16 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N— dopants. Lithographic masks may be required to protect the areas not to be subjected to that particular N— ion implantation. The formation of the lithographic masks are done by conventional lithography and etching techniques. The N— lightly doped drain implantation 18 is done with, for example, phosphorus P31 at a dosage of between about 5 E 12 to 1 E 14 atoms/cm$^2$ and an energy of between about 25 to 70 Kev.

The dielectric spacer 20 is now to be formed followed by the completion of the lightly doped drain source/drain structures. A low temperature silicon oxide deposition is preferred such as through the chemical vapor deposition of tetraethoxysilane (TEOS) at a temperature in the range of between about 500° to 800° C. or $O_3$ TEOS to a thickness of between about 1500 to 3000 Angstroms and preferably about 2000 Angstroms.

An anisotropic etching of this layer produces the dielectric spacer layer 20 on the sidewalls of the layer structures 14, 16. The preferred dry anisotropic etching uses $CF_4$ or the like.

A first silicon oxide layer 26 is formed over the field oxide and device areas. A TEOS deposition is preferred to a thickness of between about 1500 to 3000 Angstroms. A layer of silicon nitride 28 is deposited by LPCVD to a thickness of between about 1500 to 3000 Angstroms followed by a second deposition of TEOS silicon oxide 30 to a thickness of between about 2000 to 4000 Angstroms.

Using conventional lithographic and etching techniques, contact openings are made through the silicon oxide layers 26 and 30 and silicon nitride layer 28 to the silicon substrate. Opening 31 is made to the node contact region for the capacitor structure.

A first polysilicon layer 34 is deposited over oxide layer 30 by silane chemical vapor deposition either in situ doped or doped after deposition by $POCl_3$ or ion implantation. The thickness of this layer is between about 1000 to 3000 Angstroms.

A thick layer of silicon oxide 36 is deposited over layer 34, also by LPCVD with the same conditions used for layer 30, but the thickness of layer 36 is between about 1000 to 5000 Angstroms. The thick silicon oxide layer 36 is patterned by lithography and dry etching techniques so as to have its remaining portion over the planned capacitor area.

Figure 3:
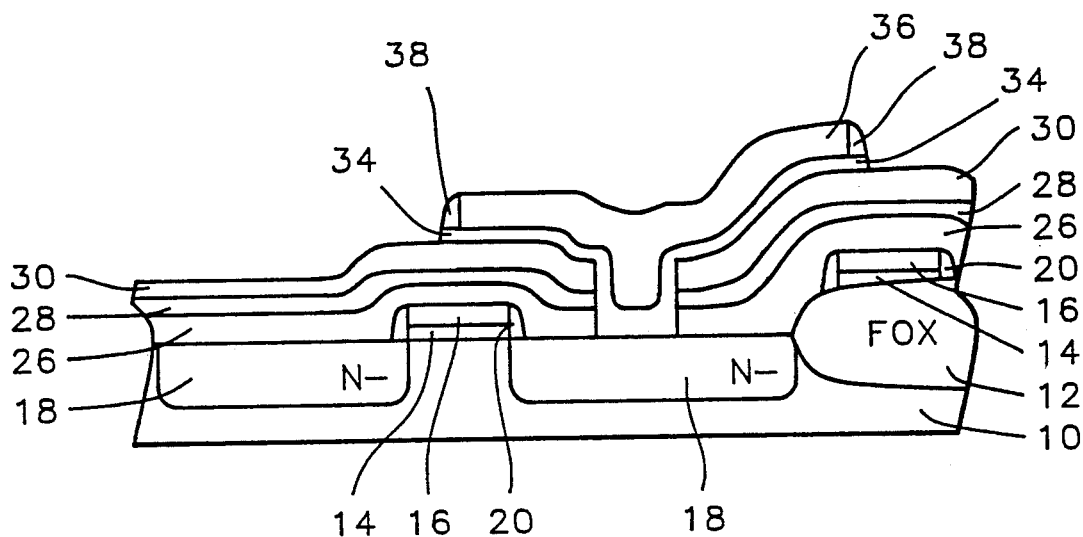

Referring now to FIG. 3, a second layer of polysilicon 38 is deposited over the first polysilicon layer 34 and the patterned thick silicon oxide layer 36. The layer 38 has a thickness of between about 2000 to 5000 Angstroms. It is deposited by LPCVD and is doped in situ or after deposition with $POCl_3$ or by ion implantation. This layer 38 will form spacers on the sidewalls of the thick silicon oxide layer 36. An anisotropic etch is performed on the polysilicon layers 34 and 38 with an etch stop at the silicon oxide layers 30 and 36. Polysilicon layer 38 will be etched away except for spacers on the sidewalls of the thick silicon oxide layer 36. Polysilicon layer 34 will be etched away leaving portions only under the silicon oxide 36 and polysilicon spacers 38 as seen in FIG. 3.

Figure 4:
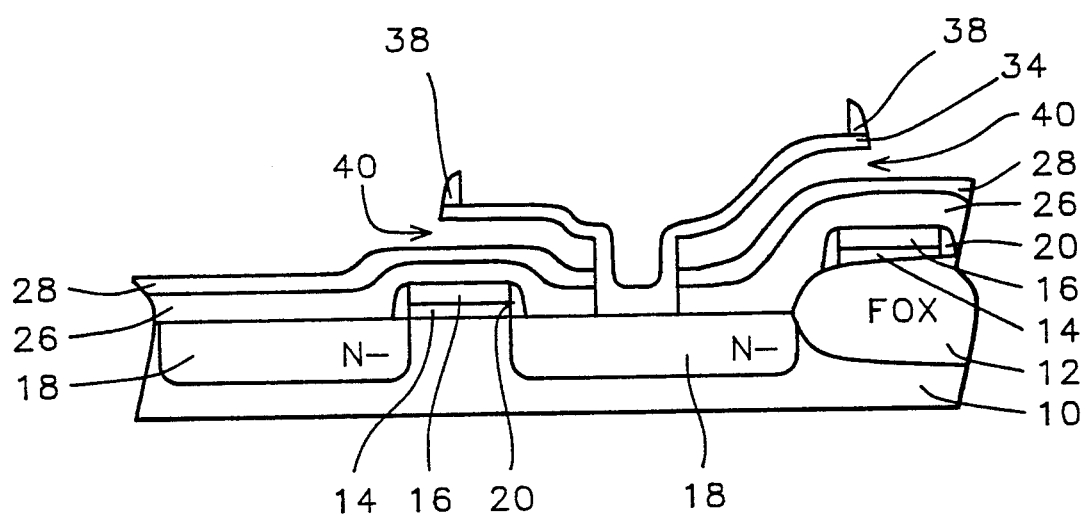

Referring now to FIG. 4, a wet dip etch is performed to remove the silicon oxide layers 30 and 36 leaving cavities 40 underneath the polysilicon layer 34. The portion of layer 34 contacting the node contact region forms the bottom electrode of the capacitor. Layers 34 and 38 together form the tub-shaped storage node of the capacitor. Because of the cavities 40, the exposed bottom surface of layer 34 provides additional storage area for the capacitor. The sidewalls 38 forming the tub shape also add storage area.

Figure 5:
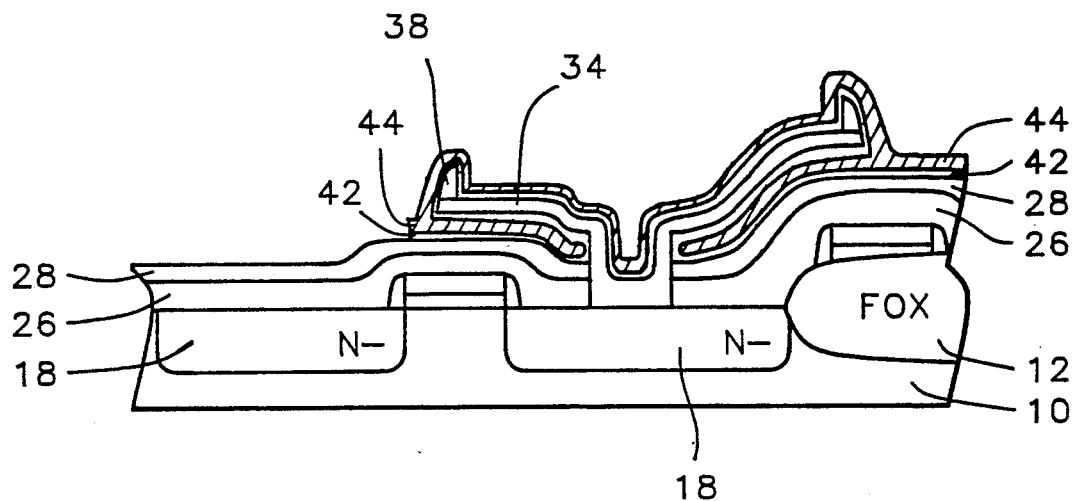

Referring now to FIG. 5, the capacitor dielectric layer 42 is now formed over all exposed surfaces of the polysilicon layers 34 and 38 which form the storage node of the capacitor. The layer is typically either composed of layers of silicon nitride and silicon oxide (NO) or layers of silicon oxide, silicon nitride and silicon oxide (ONO). In making the ONO dielectric, the first or bottom silicon oxide, O layer is usually a native oxide grown to a thickness of about 15 Angstroms. The silicon nitride, N layer is formed by LPCVD to give a resulting thickness of between about 80 to 200 Angstroms. The top silicon oxide, O layer may be formed in an oxidation furnace. The total ONO thickness is in the order of 100 to 300 Angstroms.

The top plate electrode is formed by depositing a third polysilicon layer 44 by LPCVD, doped in situ or by doped with $POCl_3$ after deposition or by ion implantation. The thickness of this layer 44 is between about 1000 to 4000 Angstroms. This layer 44 is also deposited conformally so that it covers all surfaces of the storage node layers 34 and 38 and fills the cavities 40 (shown in FIG. 4). The layers 42 and 44 are now patterned using conventional lithography and etching techniques to complete construction of the capacitor.

Figure 6:
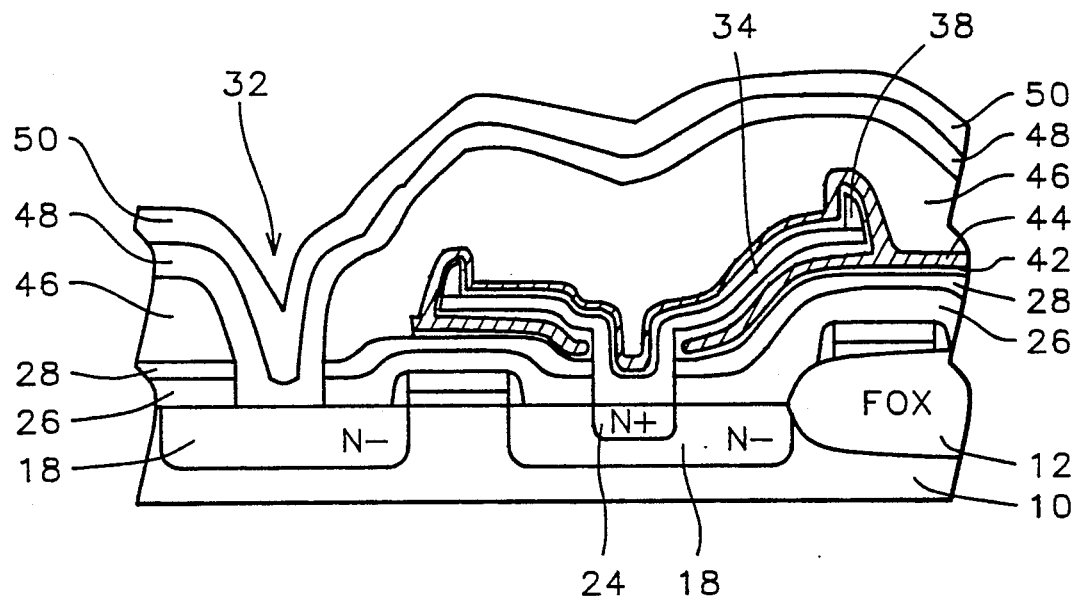

The following steps illustrate the electrical connections to the FET and the capacitor cell of the DRAM integrated circuit. Referring now to FIG. 6, a thick insulating layer 46 composed of borophosphosilicate glass (BPSG) is blanket deposited over the wafer to a thickness of between about 2000 to 7000 Angstroms. The glasseous layer is flowed at conditions 800° to 900° C. This heating will also cause formation of the N+ region 24 by outdiffusion from the polysilicon layer 34. Bit line contact opening 32 is made through the insulating layers 26 and 28.

A fourth layer of polysilicon 48 is deposited over the glasseous layer 46 by to a thickness of between about 500 to 3000 Angstroms. This layer is POCl$_3$ doped, ion implanted, or in situ doped. A layer 50 of tungsten silicide is deposited over the polysilicon layer 48. The tungsten silicide is deposited to a thickness of between about 1000 to 3000 Angstroms. Alternatively, a layer of tungsten could be deposited and heated at 800° to 900° C. or by the BPSG flow step to form tungsten silicide.

Figure 7:
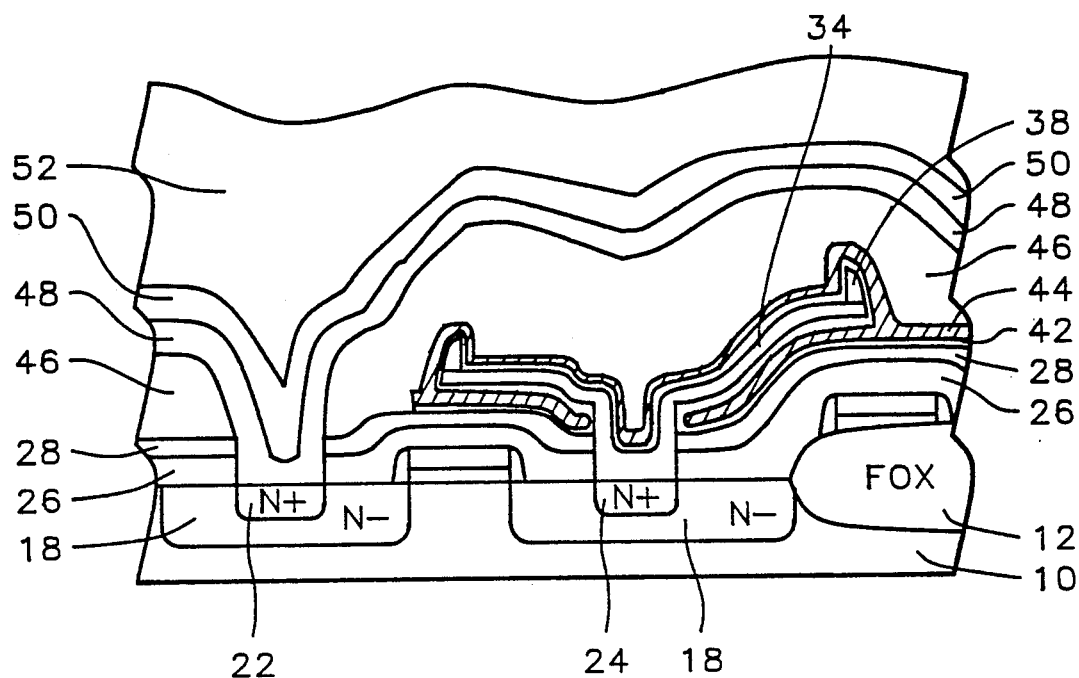
Figure 8:
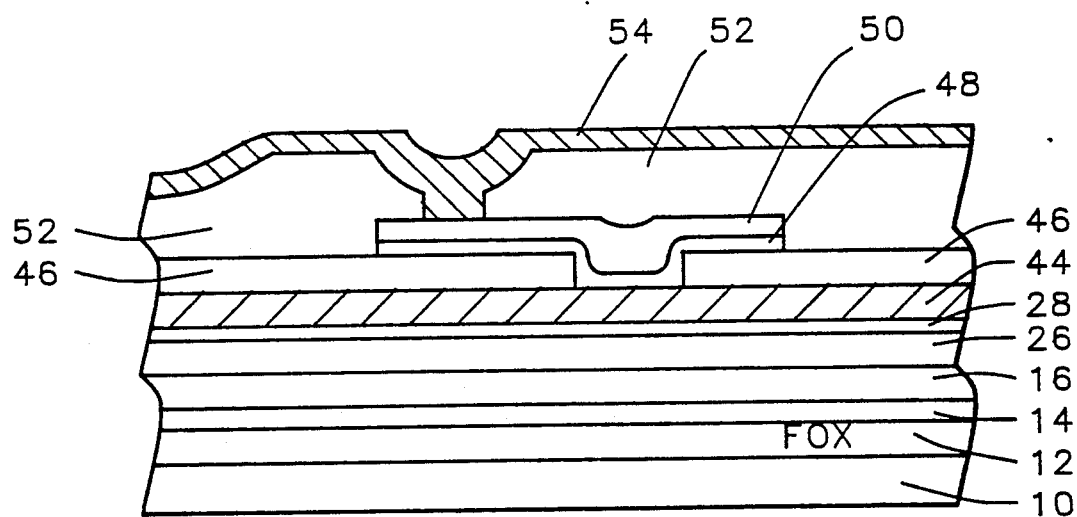

The polysilicon and tungsten silicide layers 48 and 50 are etched using conventional photolithography and etching techniques to form bit lines and/or word lines (not shown in this view). FIG. 8 shows the patterning. Referring now to FIG. 7, a thick insulating layer 52 composed of BPSG is deposited to a thickness of between about 2000 to 7000 Angstroms and flowed at 800° to 900° C., as was the first BPSG layer 46, above. This heating causes the formation of the N+ bit line region 22 from outdiffusion from the polysilicon layer 48 and deepens the N+region 24.

Figure 9:
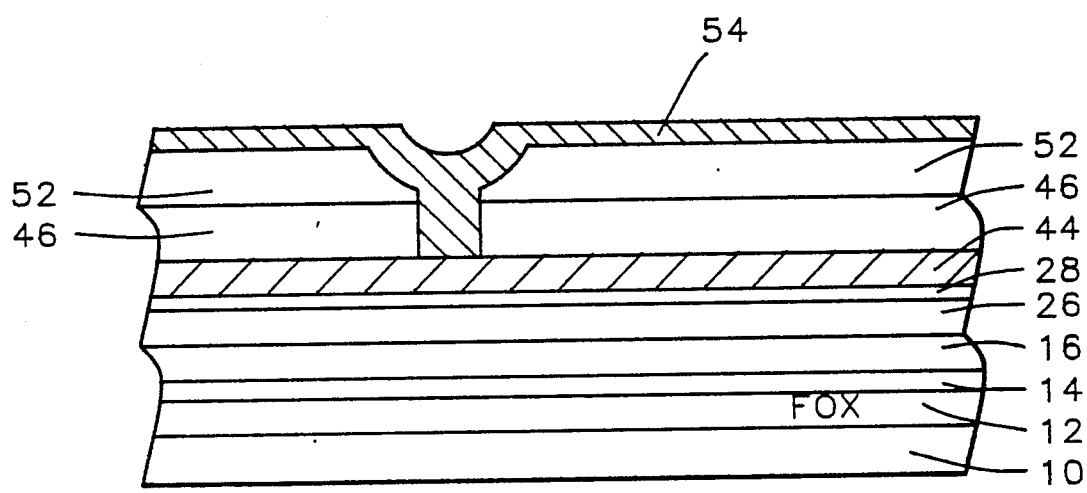
FIG. 9 is a schematic cross-sectional representation of an alternative to FIG. 8.

FIGS. 8 and 9 illustrate alternatives for metal I contacts in another portion of silicon substrate 10.

FIG. 8 illustrates the first preferred metal I contact patterning. Using conventional lithography and etching techniques, a contact opening has been made through the insulating layer 52 to tungsten silicide layer 50. A metal 54, such as Ti/TiW/AlSiCu, is sputter deposited over the wafer and within the opening completing the electrical contact to the tungsten silicide 50.

Referring to FIG. 9, a second alternative metal I patterning is shown. Using conventional lithography and etching techniques, a contact opening is made through the insulating layer 46/52 to polysilicon layer 44. A metal 54, such as Ti/TiW/AlSiCu, is sputter deposited over the wafer and within the opening completing the electrical contact to the polysilicon layer 44.

Figure 10:
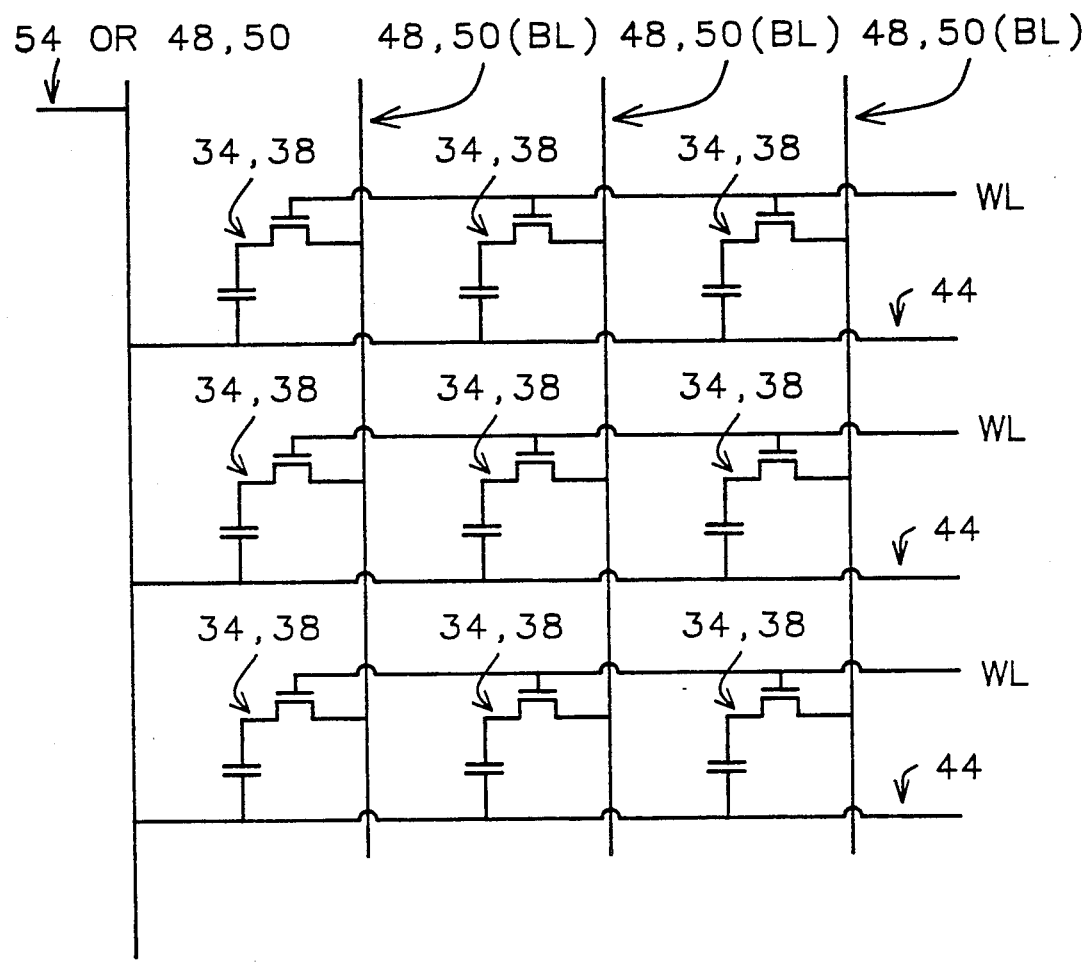
FIG. 10 illustrates a circuit diagram for the preferred embodiment of the present invention.

Referring now to FIG. 10, there is shown a circuit diagram of the integrated circuit. Capacitors are indicated by 34/38, polysilicon word lines by 44, and polysilicon/tungsten silicide bit lines by 48/50. Metal I contact 54 or polysilicon/tungsten silicide contact 48/50 is illustrated on the left side of the figure.

It should be noted that N+, P−, and P+ regions are implanted in the peripheral area only. These N+ regions are formed by implanting Arsenic ions at a dosage of 1 E 14 to 1 E 16 atoms/cm$^2$ and energy of 40 to 120 Key. P− regions are formed by implanting BF$_2$ ions at a dosage of 5 E 12 to 1 E 14 atoms/cm$^2$ and energy of 25 to 80 Key. P+ regions are formed by implanting BF$_2$ ions at a dosage of 1 E 14 to 1 E 16 atoms/cm$^2$ and energy of 40 to 120 Key. In the cell area, only N− implants are made, as described in conjunction with FIG. 1. Buried contact outdiffusions are used for the N+ contacts to the capacitor node and bit line regions.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:
   forming field oxide regions in and on a semiconductor substrate;
   forming a gate silicon oxide layer over the surface of said semiconductor substrate;
   depositing a gate polysilicon layer overlaying said gate silicon oxide layer and patterning said gate polysilicon to form gate electrodes;
   forming lightly doped drain regions within said silicon substrate;
   depositing and etching a spacer silicon oxide to form spacers on the sidewalls of said gate electrodes;
   forming a first layer of silicon oxide overlying said gate electrodes;
   depositing a layer of silicon nitride overlaying said first silicon oxide layer;
   forming a second layer of silicon oxide overlying said silicon nitride layer;
   opening a contact through said first and second silicon oxide layers and said silicon nitride layer to said lightly doped drain region within said silicon substrate which will form the node of said capacitor;
   depositing a first layer of doped polysilicon overlying said silicon nitride layer and filling said contact opening wherein portion of said first polysilicon contacting said lightly doped drain region which forms said node will be the bottom electrode of said capacitor;
   depositing a third layer of silicon oxide overlying said first polysilicon layer;
   etching away said third layer of silicon oxide overlying said first polysilicon layer;
   etching away said third layer of silicon oxide leaving portion only within area of planned said capacitor;
   depositing a second layer of polysilicon overlying said third silicon oxide layer;
   anisotropically etching said first and second polysilicon layers to remove all of said second polysilicon layer except for spacers on the sidewalls of said third silicon oxide layer to construct a tub shape and to remove all of said first polysilicon layer except for portion underlying said third silicon oxide layer and said spacers;
   etching away said second silicon oxide layer and said third silicon oxide layer leaving cavities underlying said first and second polysilicon layers wherein said first and second polysilicon layers form the storage node of said capacitor;
   depositing a capacitor dielectric layer over all surfaces of said substrate wherein said capacitor dielectric layer will cover exposed top and bottom surfaces of said first and second polysilicon layers;
   depositing a third polysilicon layer conformally so that said third polysilicon layer covers said first and second polysilicon layers and fills all said cavities underlying said first and second polysilicon layers wherein said third polysilicon layer forms the top electrode of said capacitor;
   depositing a first insulating layer over the surface of said substrate and reflowing said insulator by thermal treatment;
   depositing a fourth layer of doped polysilicon overlying said first insulating layer;
   forming a silicide layer over said fourth polysilicon layer;

depositing a second insulating layer over said silicide layer and reflowing said insulator by thermal treatment;

forming N+ regions in said lightly doped drain regions by outdiffusing dopants from the overlying doped polysilicon layers during said reflowing of said first and second insulating layers;

opening contact holes through said second insulating layer to said silicide layer; and depositing a metal layer into said contact holes to form contacts to said silicide layer to complete formation of said DRAM with capacitor.

2. The method of claim 1 wherein said thick layer of silicon oxide has a thickness of between about 1000 to 5000 Angstroms.

3. The method of claim 1 wherein said anisotropic etching away of said first and second polysilicon layers is done with a dry etcher using HBr.

4. The method of claim 1 wherein said anisotropic etching away of said first and second polysilicon layers is done with a dry etcher using chlorine chemistry.

5. The method of claim 1 wherein said etching away of second silicon oxide layer and said thick silicon oxide layer is done with a wet etch.

6. The method of claim 1 wherein said capacitor dielectric layer is composed of layers of silicon oxide, silicon nitride, and silicon oxide.

7. The method of claim 1 wherein said third polysilicon layer has a thickness of between about 1000 and 4000 Angstroms.

8. The method of claim 1 wherein said first thick insulating layer is composed of borophosphosilicate glass with a thickness of between about 2000 to 7000 Angstroms.

9. The method of claim 1 wherein said polysilicon layers are doped with $POCl_3$.

10. The method of claim 1 wherein said polysilicon layers are doped in situ.

11. The method of claim 1 wherein said polysilicon layers are doped by ion implantation.

12. The method of claim 1 wherein said fourth layer of polysilicon has a thickness of between about 500 to 3000 Angstroms.

13. The method of claim 1 wherein said silicide layer is formed by depositing tungsten silicide to a thickness of between about 1000 to 3000 Angstroms.

14. The method of claim 1 wherein said third thick insulating layer is composed of borophosphosilicate glass with a thickness of between about 3000 to 7000 Angstroms.

15. A method for fabricating a dynamic random access memory having a capacitor comprising:

selectively forming field oxide areas on the surface of a semiconductor substrate while leaving device areas for fabrication of semiconductor devices;

forming device structures within said device areas of said semiconductor substrate wherein said device structures include a capacitor node contact region within said silicon substrate;

forming a first oxide layer over said device and field oxide areas;

and forming said capacitors by:

depositing a layer of silicon nitride overlying said first silicon oxide layer;

forming a second layer of silicon oxide overlying said silicon nitride layer;

opening a contact through said first and second silicon oxide layers and said silicon nitride layer to said capacitor node contact region;

depositing a first layer of polysilicon overlying said silicon nitride layer and filling said contact opening;

depositing a third layer of silicon oxide overlying said first polysilicon layer;

patterning said third layer of silicon oxide so as to leave remaining portions of said layer only in the area of planned said capacitor;

depositing a second layer of polysilicon overlying said third silicon oxide layer;

anisotropically etching said first and second polysilicon layers to remove all of said second layer except for spacers on the sidewalls of said third silicon oxide layer to construct a tub shape and to remove all of said first polysilicon layer except for portions of said layer underlying said third oxide layer and underlying said spacers;

etching away said second silicon oxide layer and said third silicon oxide layer leaving cavities underlying said first and second polysilicon layers;

depositing a capacitor dielectric layer over all exposed surfaces of said substrate;

depositing a third polysilicon layer conformally so that said third polysilicon layer covers said first and second polysilicon layers and fills all said cavities underlying said first and second polysilicon layers wherein said third polysilicon layer can be connected as the top electrode of the capacitor;

depositing a first insulating layer over the surface of said substrate and reflowing said insulator by thermal treatment;

depositing a fourth layer of polysilicon in contact with the third layer of polysilicon said first insulating layer;

forming a silicide layer over said fourth polysilicon layer;

depositing a second insulating layer over said silicide layer and reflowing said insulator by thermal treatment;

opening contact holes through said insulating layers to said silicide layer; and depositing a metal layer into said contact holes to form contacts to said silicide layer to complete formation of said DRAM with capacitor.

16. The method of claim 15 wherein said device structures in said device areas are source/drain and gate field effect transistor structures which form a dynamic random access memory cell together with said capacitor.

17. The method of claim 15 wherein the portion of said first polysilicon layer contacting said capacitor node contact region forms the bottom node of said electrode, said first and second polysilicon layers remaining form said tub-shaped storage node of said capacitor and said third polysilicon layer forms the top electrode of said capacitor.

18. The method of claim 15 wherein the thickness of said second oxide layer is between about 1500 to 3000 Angstroms.

19. The method of claim 15 wherein the thickness of said first polysilicon layer is between about 1000 to 3000 Angstroms.

20. The method of claim 15 wherein the thickness of said thick oxide layer is between about 1000 to 5000 Angstroms.

21. The method of claim 15 wherein the thickness of said second polysilicon layer is between about 2000 to 5000 Angstroms.

22. The method of claim 15 wherein said capacitor dielectric is composed of layers of silicon oxide, silicon nitride and silicon oxide.

23. The method of claim 15 wherein the thickness of said third polysilicon layer is between about 1000 to 4000 Angstroms.

24. The method of claim 15 wherein the thickness of said fourth polysilicon layer is between about 500 to 3000 Angstroms.

25. The method of claim 15 wherein said silicide layer formed by depositing tungsten silicide to a thickness of said between about 1000 to 3000 Angstroms.

* * * * *